(12) United States Patent
Kim

(10) Patent No.: US 10,948,524 B2
(45) Date of Patent: Mar. 16, 2021

(54) RELAY-WELDING DETECTION DEVICE AND DETECTION METHOD

(71) Applicant: LSIS CO., LTD., Anyang-si (KR)

(72) Inventor: Bumyoul Kim, Anyang-si (KR)

(73) Assignee: LSIS CO., LTD., Anyang-si (KR)

( * ) Notice: Subject to any disclaimer, the term of this patent is extended or adjusted under 35 U.S.C. 154(b) by 29 days.

(21) Appl. No.: 16/476,759

(22) PCT Filed: Feb. 15, 2017

(86) PCT No.: PCT/KR2017/001674
§ 371 (c)(1),
(2) Date: Jul. 9, 2019

(87) PCT Pub. No.: WO2018/131746
PCT Pub. Date: Jul. 19, 2018

(65) Prior Publication Data
US 2019/0353708 A1 Nov. 21, 2019

(30) Foreign Application Priority Data
Jan. 11, 2017 (KR) .......... 10-2017-0004356

(51) Int. Cl.
*G01R 19/10* (2006.01)
*H03M 1/12* (2006.01)
(Continued)

(52) U.S. Cl.
CPC .............. *G01R 19/10* (2013.01); *G01R 19/22* (2013.01); *G01R 31/3278* (2013.01); *H03M 1/12* (2013.01)

(58) Field of Classification Search
CPC .... G01R 19/10; G01R 31/3278; G01R 19/22; H03M 1/12; B60L 3/00; B60L 3/0069; H01H 2047/003
(Continued)

(56) References Cited

U.S. PATENT DOCUMENTS

2006/0007622 A1  1/2006  Furukawa
2013/0268158 A1  10/2013  Kurita
(Continued)

FOREIGN PATENT DOCUMENTS

CN  100497035 C  6/2009
CN  102623948 A  8/2012
(Continued)

OTHER PUBLICATIONS

Extended European Search Report for related European Application No. 17891322.4; action dated Jul. 20, 2020; (6 pages).
(Continued)

*Primary Examiner* — Melissa J Koval
*Assistant Examiner* — Trung Q Nguyen
(74) *Attorney, Agent, or Firm* — K&L Gates LLP

(57) ABSTRACT

The objective of the present invention is to provide a relay-welding detection device and method, the device and method capable of determining, whether a relay is welded, by using an analog-digital converter (ADC). Another relay-welding detection device according to the present invention comprises: a first ADC for measuring a voltage of a relay input terminal; a second ADC for measuring a voltage of a relay output terminal; and a CPU for comparing the voltage of the relay input terminal with the voltage of the relay output terminal and determining whether the relay is welded.

3 Claims, 4 Drawing Sheets

(51) Int. Cl.
*G01R 19/22* (2006.01)
*G01R 31/327* (2006.01)

(58) Field of Classification Search
USPC .............. 324/415–424, 600, 607, 76.11, 120
See application file for complete search history.

(56) References Cited

U.S. PATENT DOCUMENTS

| | | | | |
|---|---|---|---|---|
| 2016/0190848 A1* | 6/2016 | Chen | ................... | H02J 7/00712 320/162 |
| 2019/0210481 A1* | 7/2019 | Ishida | ................... | B60L 3/0046 |

FOREIGN PATENT DOCUMENTS

| | | |
|---|---|---|
| CN | 103500358 A | 1/2014 |
| CN | 104467121 A | 3/2015 |
| CN | 106232415 A | 12/2016 |
| JP | H10670450 A | 3/1994 |
| JP | H107245865 A | 9/1995 |
| JP | H07296695 A | 11/1995 |
| JP | H09233674 A | 9/1997 |
| JP | 2008312327 A | 12/2008 |
| JP | 2011055631 A | 3/2011 |
| JP | 2013093297 A | 5/2013 |
| JP | 2013219873 A | 10/2013 |
| JP | 2013219955 A | 10/2013 |
| JP | 2014500570 A | 1/2014 |
| JP | 2014042406 A | 3/2014 |
| JP | 2014048050 A | 3/2014 |
| JP | 2016063736 A | 4/2016 |
| JP | 2016139517 A | 8/2016 |
| JP | 2016143565 A | 8/2016 |
| KR | 20090112993 A | 10/2009 |
| KR | 20110062136 A | 6/2011 |
| KR | 20140136844 A | 12/2014 |
| WO | 2016121727 A1 | 8/2016 |

OTHER PUBLICATIONS

Japanese Office Action for related Japanese Application No. 2019-537386; action dated Jul. 14, 2020; (3 pages).
Korean Notice of Allowance for related Korean Application No. 10-2017-0004356; action dated Mar. 10, 2020; (2 pages).
Korean Office Action for related Korean Application No. 10-2017-0004356; action dated Oct. 18, 2019; (5 pages).
International Search Report for related International Application No. PCT/KR2017/001674; report dated Jul. 19, 2018; (3 pages).
Written Opinion for related International Application No. PCT/KR2017/001674; report dated Jul. 19, 2018; (6 pages).
Chinese Office Action issued in corresponding Chinese Patent Application No. 201780081922.1; Office Action dated Nov. 16, 2020.

* cited by examiner

INPUT(OUTPUT)   Ref

| STATE | RELAY | ADC 1 | ADC 2 (NORMAL OPERATION) | ADC 2 (ABNORMAL OPERATION) | DIAGNOSIS IN ABNORMAL OPERATION |
|---|---|---|---|---|---|
| CHARGING STANDBY | OFF | a | ≠ a | = a | RELAY WELDING |
| CHARGING IN PROGRESS | ON | a | = a | ≠ a | RELAY ERROR |
| CHARGING COMPLETE | OFF | a | ≠ a | = a | RELAY WELDING |
| ERROR | OFF | a | ≠ a | = a | RELAY WELDING |

RELAY-WELDING DETECTION DEVICE AND DETECTION METHOD

CROSS-REFERENCE TO RELATED APPLICATIONS

This application is the National Stage filing under 35 U.S.C. 371 of International Application No. PCT/KR2017/001674, filed on Feb. 15, 2017, which claims the benefit of earlier filing date and right of priority to Korean Application No. 10-2017-0004356, filed on Jan. 11, 2017, the contents of which are all hereby incorporated by reference herein in their entirety.

TECHNICAL FIELD

The present disclosure relates to a relay-welding detection device and method, and more particularly, to a relay-welding detection device and method that may determine whether or not a relay is welded by using an analog-digital converter (ADC).

BACKGROUND ART

Recently, dissemination of electric vehicles (EVs) has emerged as part of an environmental preservation policy. In order to commercialize such EVs, a charging infrastructure for electric charging needs to be established. Chargers of the EVs can charge the EVs by using a relay.

In detail, in a charging standby state or a charging completion state, a relay inside the charger needs to be turned off to stop charging and allow a user to operate the charger.

Then, when an EV is to be charged, the relay needs to be turned on to perform charging. That is, the EV is charged by using a switching operation of the relay.

Here, due to frequent switching operations of the relay, the relay may be loosened and welding may occur. Due to such a welding phenomenon, the relay is not turned off and always remains on. Thus, there is a risk of electric shock when the charger is used.

Therefore, a detection device needs to be provided to determine whether the relay is welded, to thereby prevent such safety accidents.

FIG. 1 is a diagram illustrating a relay-welding detection device in the related art.

As shown in FIG. 1, the relay-welding detection device in the related art includes a welding relay WELDING RELAY connected to a relay input terminal INPUT, and a photocoupler PC connected to a relay output terminal OUTPUT.

In addition, a main relay MAIN RELAY that performs a switching operation for a charger is disposed between the relay input terminal INPUT and the relay output terminal OUTPUT.

Detecting a welding phenomenon is to detect a state in which the main relay MAIN RELAY remains on even when the main relay MAIN RELAY should remain off.

Accordingly, when the main relay MAIN RELAY remains off, an input WRin is applied to turn on the welding relay WELDING RELAY. At this point, when the main relay MAIN RELAY is not welded, a path via which a signal is transmitted through the main relay MAIN RELAY is not established. However, when the main relay MAIN RELAY is welded, the path via which the signal is transmitted through the main relay MAIN RELAY is established.

Therefore, when the main relay MAIN RELAY is welded, the signal is transmitted through the photocoupler PC and detected as an output WRout. By using this method, whether the relay is welded is determined.

When whether the relay is welded is determined by using the above-described method, the welding relay WELDING RELAY and the photocoupler PC are additionally needed, thus resulting in a disadvantage with respect to arrangement.

In addition, when welding is detected, the welding relay WELDING RELAY may also be welded. Accordingly, reliability of the relay-welding detection device may also deteriorate.

DISCLOSURE

Technical Problem

In order to solve the above-described problems in the related art, one aspect of the present disclosure is to provide a relay-welding detection device and method that may determine whether a relay is welded by using an analog-digital converter (ADC).

Technical Solution

To achieve these and other advantages and in accordance with the purpose of the present disclosure, as embodied and broadly described herein, there is provided a relay-welding detection device including a plurality of analog-digital converters (ADCs) and a central processing unit (CPU).

The plurality of ADCs may output an input voltage and an output voltage of a relay.

The central processing unit may compare a voltage of a relay input terminal with a voltage of a relay output terminal, and thus, determine whether welding occurs.

Advantageous Effect

In the present disclosure, same operations may be implemented by simply measuring a voltage using an analog-digital converter (ADC) in a relay-welding detection device, instead of a photocoupler and a welding relay in a relay-welding detection device in the related art. Since additional relays and photocouplers are not needed, a unit cost may be reduced In addition, in the present disclosure, since a switching operation of the relay-welding detection device in the related art is not needed, switch noise may not occur. Thus, the life of the relay may be extended.

BEST MODE OF THE DISCLOSURE

Modes for Carrying Out the Preferred Embodiments

Hereinafter, a relay-welding detection device and method according to the present disclosure will be described with reference to the accompanying drawings.

Figure 1:
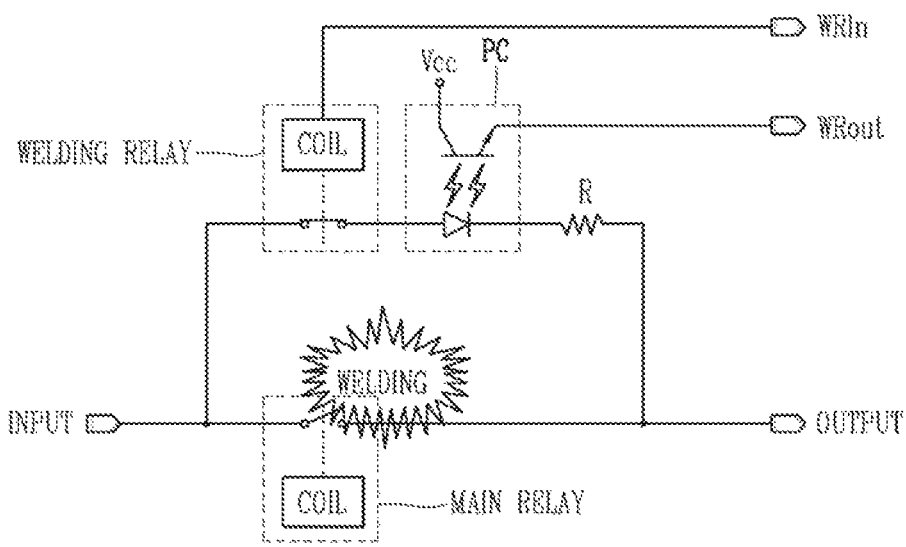
FIG. 1 is a diagram illustrating a relay-welding detection device in the related art.
Figure 2:
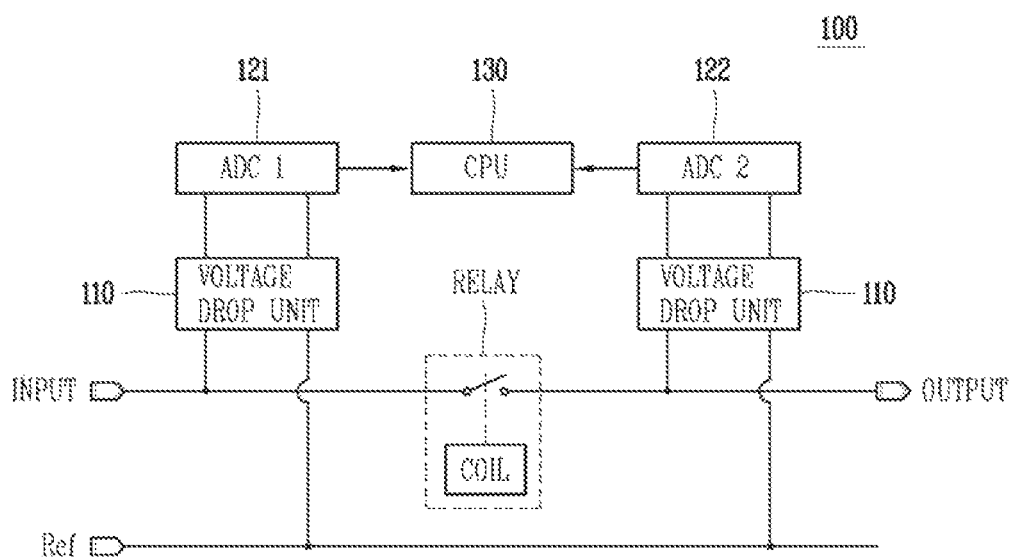
FIG. 2 is a diagram illustrating a relay-welding detection device according to an embodiment of the present disclosure.
Figures 3, 4:
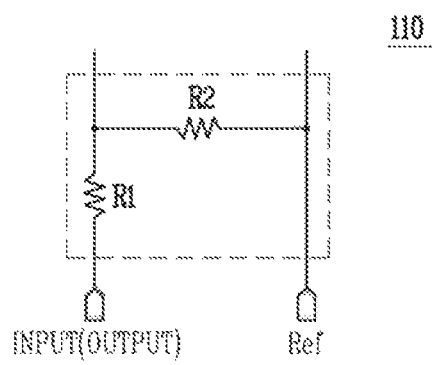
FIG. 3 is a diagram illustrating a voltage drop unit in the relay-welding detection device according to an embodiment of the present disclosure.
FIG. 4 is a table showing a diagnosis method performed by the relay-welding detection device according to an embodiment of the present disclosure.

FIG. 2 is a diagram illustrating a relay-welding detection device according to an embodiment of the present disclosure. FIG. 3 is a diagram illustrating a voltage drop unit in the relay-welding detection device according to an embodiment of the present disclosure.

As shown in FIG. 2, a relay-welding detection device 100 according to an embodiment of the present disclosure includes a first analog-digital converter (ADC) 121 for measuring a voltage of a relay input terminal INPUT, a second ADC 122 for measuring a voltage of a relay output terminal OUTPUT, a central processing unit (CPU) 130 for comparing the measured voltages, and a voltage drop unit 110 for dropping voltages of the relay input terminal INPUT and the relay output terminal OUTPUT.

The first ADC 121 is connected to the relay input terminal INPUT of a relay RELAY and converts a voltage in an analogue form, applied to the relay input terminal INPUT, to a signal in a digital form and outputs the signal to the CPU 130.

Also, the first ADC 121 receives a reference voltage ref in a form of direct current (DC), and may measure a voltage applied to the relay input terminal INPUT using the reference voltage ref. Here, the reference voltage ref may correspond to a ground voltage.

The voltage drop unit 110 may be added between the first ADC 121 and the relay input terminal INPUT. The voltage drop unit 110 may convert the voltage applied to the relay input terminal INPUT to match a voltage specified for the first ADC 121 to thereby improve reliability of the relay-welding detection device 100.

As shown in FIG. 3, the voltage drop unit 110 may include a first resistor R1 connected in series to the relay input terminal INPUT, and a second resistor R2 connected to the relay input terminal INPUT and a point to which the reference voltage ref is applied.

The second ADC 122 is connected to the relay output terminal OUTPUT of the relay and converts a voltage in an analogue form, applied to the relay output terminal OUTPUT, to a signal in a digital form and outputs the digital signal to the CPU 130.

Also, the second ADC 122 may receive the reference voltage ref in the DC form, and measure a voltage applied to the relay output terminal OUTPUT using the reference voltage ref. Here, the reference voltage ref may correspond to a ground voltage.

The voltage drop unit 110 may be added between the second ADC 122 and the relay output terminal OUTPUT. In addition, the voltage drop unit 110 may convert the voltage, applied to the relay output terminal OUTPUT, to match a voltage specified for the second ADC 122 to thereby improve reliability of the relay-welding detection device 100.

As shown in FIG. 3, the voltage drop unit 110 may include the first resistor R1 connected in series to the relay output terminal OUTPUT, and the second resistor R2 connected to the relay output terminal OUTPUT and the point to which the reference voltage ref is applied.

FIG. 4 is a table showing a diagnosis method performed by the relay-welding detection device 100 according to an embodiment of the present disclosure.

The CPU 130 determines whether or not the relay RELAY is welded, by using digital signals applied from the first ADC 121 and the second ADC 122.

Welding of the relay RELAY is recognized as a phenomenon that may occur when the relay RELAY remains on although the relay RELAY should be in an off state. Accordingly, a state of the charger when the relay RELAY should remain off is determined.

That is, the charger needs to be turned off in such cases as a charging standby state for preparing for charging, a charging completion state when charging is complete and no further charging is to be performed, or an error state in which charging cannot be performed due to a charger error. Accordingly, only in these three cases, whether welding occurs or not may be a problem.

Therefore, the CPU 130 determines whether a state of the charger corresponds to the charging standby state, the charging completion state, or the error state.

Then, a voltage of the relay input terminal INPUT is measured using a digital signal applied from the first ADC 121. For convenience of description, it is assumed that a voltage of a V is applied to the relay input terminal INPUT.

Next, a voltage of the relay output terminal OUTPUT is measured using a digital signal applied from the second ADC 122.

In this case, since the relay RELAY is off, the voltage of a V that is the voltage of the relay input terminal INPUT should not be measured. However, when the voltage of a V is measured, it may be determined that the relay RELAY is welded.

On the other hand, when the charger is in the charging state, the relay RELAY needs to be turned on. Therefore, the voltage of a V should be measured at the relay output terminal OUTPUT through the second ADC 122. However, when the voltage of a V is not measured, it may be determined that an error other than welding has occurred in the relay RELAY.

As such, same operations may be implemented by simply measuring a voltage using an ADC in the relay-welding detection device in the present disclosure, instead of a photocoupler and a welding relay in the relay-welding detection device in the related art.

In addition, since additional relays and photocouplers are not needed, a unit cost may be reduced. Also, since a switching operation by the relay-welding detection device in the related art is not needed, switch noise does not occur, and thus, the life of the relay is extended.

Figure 5:
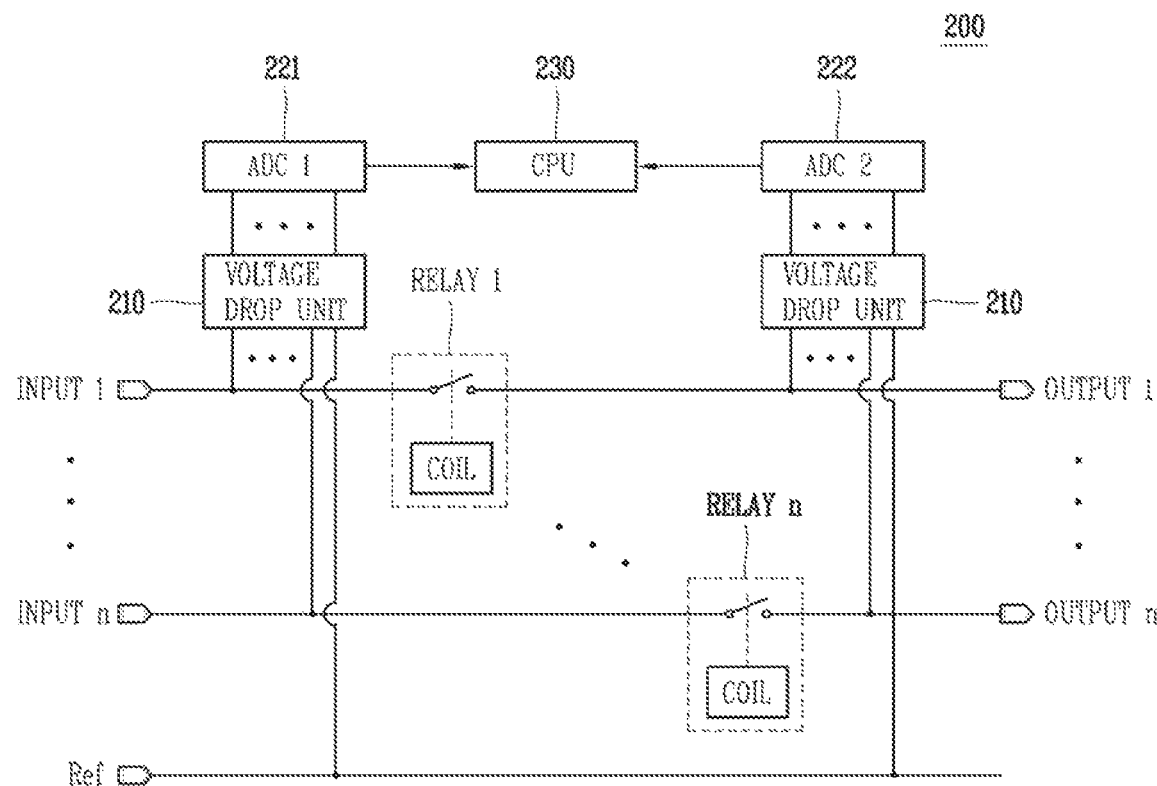
FIG. 5 is a diagram illustrating a relay-welding detection device according to another embodiment of the present disclosure.
Figure 6:
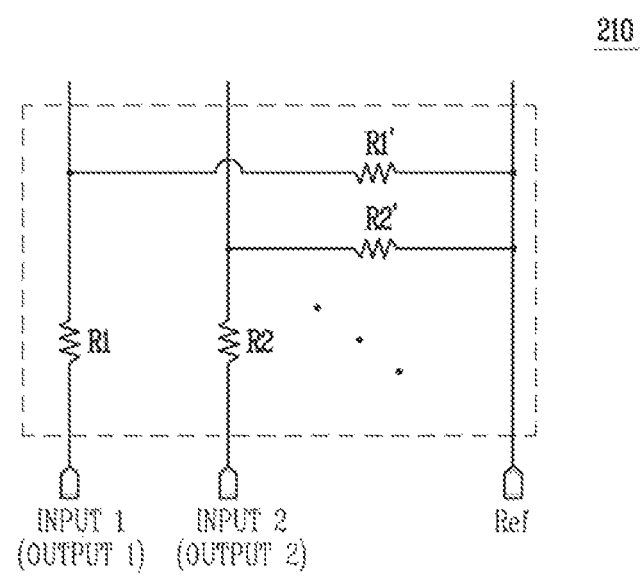
FIG. 6 is a diagram illustrating a voltage drop unit in the relay-welding detection device according to another embodiment of the present disclosure.

FIG. 5 is a diagram illustrating a relay-welding detection device according to another embodiment of the present disclosure. FIG. 6 is a diagram illustrating a voltage drop unit in the relay-welding detection device according to another embodiment of the present disclosure.

As shown in FIG. 5, a relay-welding detection device 200 according to another embodiment of the present disclosure includes a first ADC 221 for measuring voltages of a plurality of relay input terminals INPUT 1 to INPUT n, a second ADC 222 for measuring voltages of a plurality of relay output terminals OUTPUT 1 to OUTPUT n, a CPU 230 for comparing the measured voltages, and a voltage drop unit 210 for dropping voltages of the relay input terminals INPUT 1 to INPUT n and the relay output terminals OUTPUT 1 to OUTPUT n.

Here, the relay RELAY may include a plurality of relays RELAY 1 to RELAY n, that is, a first relay RELAY 1 to an nth relay RELAY n. Accordingly, the relay input terminal INPUT may also include the plurality of relay input terminals INPUT 1 to INPUT n, that is, a first relay input terminal INPUT 1 to an nth relay input terminal INPUT n. The relay output terminal OUTPUT may also include the plurality of relay output terminals OUTPUT 1 to OUTPUT n, that is, a first relay output terminal OUTPUT 1 to an nth relay output terminal OUTPUT n.

The first ADC 221 is connected to the first relay input terminal INPUT 1 to the nth relay input terminal INPUT n, and converts voltages in an analogue form, applied to the plurality of relay input terminals INPUT 1 to INPUT n, to signals in a digital form and outputs the signals to the CPU 230.

Also, the first ADC 221 receives the reference voltage ref in a DC form, and may measure voltages applied to the plurality of relay input terminals INPUT 1 to INPUT n using the reference voltage ref. Here, the reference voltage ref may correspond to a ground voltage.

In addition, the voltage drop unit 210 may be added between the first ADC 221 and the plurality of relay input terminals INPUT 1 to INPUT n. The voltage drop unit 210 may convert the voltages, applied to the plurality of relay input terminals INPUT 1 to INPUT n, to match a voltage specified for the first ADC 221 to thereby improve reliability of the relay-welding detection device 200.

As shown in FIG. 6, the voltage drop unit 210 may include a plurality of resistors R1 to Rn connected in series to the plurality of relay input terminals INPUT 1 to INPUT n, respectively, and a plurality of resistors R1' to Rn' connected to the plurality of relay input terminals INPUT 1 to INPUT n and a point to which the reference voltage ref is applied.

The second ADC 222 is connected to the first relay output terminal OUTPUT 1 to the nth relay output terminal OUTPUT n, and converts voltages in an analogue form, applied to the plurality of relay output terminals OUTPUT 1 to OUTPUT n, to a signal in a digital form and outputs the signal to the CPU 230.

Also, the second ADC 222 receives the reference voltage ref in the DC form, and may measure voltages applied to the plurality of relay output terminals OUTPUT 1 to OUTPUT n using the reference voltage ref. Here, the reference voltage ref may correspond to a ground voltage.

In addition, the voltage drop unit 210 may be added between the second ADC 222 and the plurality of relay output terminals OUTPUT 1 to OUTPUT n. The voltage drop unit 210 may convert the voltages, applied to the plurality of relay output terminals OUTPUT 1 to OUTPUT n, to match a voltage specified for the second ADC 222 to thereby improve reliability of the relay-welding detection device 200.

As shown in FIG. 6, the voltage drop unit 210 may include a plurality of resistors R1 to Rn connected in series to the plurality of relay output terminals OUTPUT 1 to OUTPUT n, respectively, and a plurality of resistors R1' to Rn' connected to the plurality of relay output terminals OUTPUT 1 to OUTPUT n and a point to which the reference voltage ref is applied.

The CPU 230 determines whether the plurality of relays RELAY 1 to RELAY n are welded, by using digital signals applied from the first ADC 221 and the second ADC 222.

Welding of the plurality of relays RELAY 1 to RELAY n is recognized as a phenomenon that may occur when the plurality of relays RELAY 1 to RELAY n remain on although the plurality of relays RELAY 1 to RELAY n need to be in an off state. Accordingly, a state of the charger when the relays RELAY 1 to RELAY n should remain off is determined.

That is, the charger needs to be turned off in such cases as a charging standby state for preparing for charging, a charging completion state when charging is complete and no further charging is to be performed, or an error state in which charging cannot be performed due to a charger error. Accordingly, only in these three cases, whether welding occurs or not may be a problem. Therefore, first, the CPU 130 determines whether the charger is in the charging standby state, the charging completion state, or the error state.

Then, voltages of the plurality of relay input terminals INPUT 1 to INPUT n are measured using digital signals applied from the first ADC 221. For convenience of description, it is assumed that a voltage of a V is applied to the plurality of relay input terminals INPUT 1 to INPUT n.

Next, voltages of the plurality of relay output terminals OUTPUT 1 to OUTPUT n are measured using digital signals applied from the second ADC 222.

In this case, since the relays RELAY 1 to RELAY n are off, the voltage of a V that is a voltage of the relays RELAY 1 to RELAY n should not be measured. However, when the voltage of a V is measured, it may be determined that the relays RELAY 1 to RELAY n are welded.

Here, voltages of the plurality of relay input terminals INPUT 1 to INPUT n and voltages of the relay output terminals OUTPUT 1 to OUTPUT n should be compared with each other on a one-to-one basis. That is, a voltage of the first relay input terminal INPUT 1 needs to be compared with a voltage of the first relay output terminal OUTPUT 1, and a voltage of the nth relay input terminal INPUT n needs to be compared with a voltage of the nth relay output terminal OUTPUT n.

When the charger is in the charging state, the plurality of relays RELAY 1~RELAY n should be turned on.

Therefore, voltages of the relay output terminals OUTPUT 1 to OUTPUT n must be measured at a V through the second ADC 222. However, when the voltage of a V is not measured, it may be determined that an error other than welding has occurred in the relays RELAY 1~RELAY n.

As such, in the present disclosure, same operations may be implemented by simply measuring a voltage using an ADC in the relay-welding detection device, instead of a photocoupler and a welding relay in the relay-welding detection device in the related art.

In addition, in the present disclosure, since additional relays and photocouplers are not needed, a unit cost may be reduced. Also, since a switching operation by the relay-welding detection device is not needed, switch noise does not occur, and thus, the life of the relay is extended.

Figure 7:
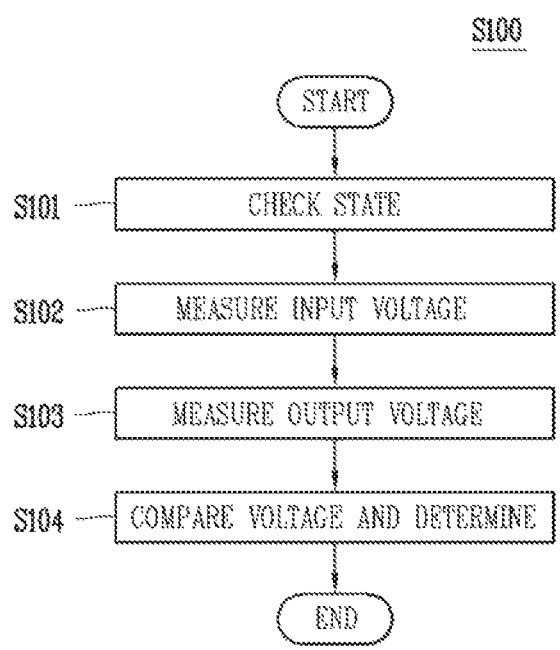
FIG. 7 is a diagram illustrating a sequence in a relay-welding detection method according to the present disclosure.

FIG. 7 is a diagram illustrating a sequence in a relay-welding detection method according to the present disclosure.

As shown in FIG. 7, the relay-welding detection method (S100) according to the present disclosure includes checking a state (S101), measuring an input voltage (S102), measuring an output voltage (S103), and comparing voltages and determining (S104).

In the checking of a state (S101), a charging state of a charger and an error state are checked, and it is determined whether the relay-welding detection method (S100) is to be performed.

In detail, welding of the relay RELAY is recognized as a phenomenon that may occur when the relay RELAY remains on although the relay RELAY should be in an off state. Accordingly, a state of the charger when the relay RELAY should remain off is determined. That is, the charger needs to be turned off in such cases as a charging standby state for preparing for charging, a charging completion state when charging is complete and no further charging is to be performed, or an error state in which charging cannot be performed due to a charger error. Accordingly, only in these three cases, whether welding occurs or not may be a problem.

Therefore, first, the CPU 130 determines whether the charger is in the charging standby state, the charging completion state, or the error state.

Then, an input voltage applied to the relay input terminal INPUT of the relay RELAY is measured (S101). Here, the input voltage to the relay may be converted into a digital signal using the ADC, and then, measured. When the input voltage is applied to the ADC, the input voltage may be dropped to match a voltage specified for the ADC, and then, measured.

Next, an output voltage applied to the relay output terminal OUTPUT of the relay RELAY is measured (S102). Here, the output voltage of the relay RELAY may be converted into a digital signal using an ADC, and then, measured. When the output voltage is applied to the ADC, the output voltage may be dropped to match a voltage specified for the ADC, and then, measured.

Last, a voltage measured at the relay input terminal INPUT is compared with a voltage measured at the relay output terminal OUTPUT, and whether the relay is welded is diagnosed (S104). For convenience of description, it is assumed that a voltage of a V is applied to the relay input terminal INPUT.

In this case, since the relay RELAY is off, the voltage of a V that is a voltage of the relay input terminal INPUT should not be measured at the relay output terminal OUTPUT. However, when the voltage of a V is measured, it may be determined that the relay RELAY is welded.

As such, same operations may be implemented by simply measuring a voltage using an ADC in the relay-welding detection device in the present disclosure, instead of a photocoupler and a welding relay in the relay-welding detection device in the related art.

In addition, since additional relays and photocouplers are not needed, a unit cost may be reduced. Also, since a switching operation by the relay-welding detection device is not needed, switch noise may not occur, and thus, the life of the relay may be extended.

While a number of embodiments have been described above in detail, it should be construed as being illustrative of exemplary embodiments rather than limiting the scope of the disclosure. Accordingly, the present disclosure is not limited to the embodiments described above, but is defined by the appended claims and equivalents of the appended claims.

The invention claimed is:

1. A relay-welding detection device, the device comprising:
   a first analog-to-digital converter (ADC) that measures a voltage of a relay input terminal;
   a second ADC that measures a voltage of a relay output terminal; and
   a central processing unit (CPU) that determines whether welding occurs by comparing the voltage of the relay input terminal with the voltage of the relay output terminal,
      wherein, when a charger corresponds to one of a charging state, a charging completion state, or an error state,
         the CPU determines that welding occurs when the voltage of the relay input terminal is the same as the voltage of the relay output terminal, and
         the CPU determines that welding does not occur when the voltage of the relay input terminal is different from the voltage of the relay output terminal;
   a first voltage drop unit that converts the voltage of the relay input terminal to match a specification of the first ADC, wherein the first voltage drop unit comprises:
      a first resistor connected in series to the relay input terminal, and
      a second resistor connected to the relay input terminal and a point to which a reference voltage is applied; and
   a second voltage drop unit that converts the voltage of the relay output terminal to match a specification of the second ADC, wherein the second voltage drop unit comprises:
      a third resistor connected in series to the relay output terminal, and
      a fourth resistor connected to the relay output terminal and the point to which the reference voltage is applied.

2. The device of claim 1, wherein each of the first voltage drop unit and the second voltage drop unit comprises a plurality of resistors.

3. The device of claim 1, wherein a plurality of relay input terminals are provided as the relay input terminal, and output voltages of the plurality of relay input terminals in an analog form, respectively, to the first ADC by being connected to the first ADC, and
   wherein a plurality of relay output terminals are provided as the relay output terminal, and output voltages of the plurality of relay output terminals in an analog form, respectively, to the second ADC by being connected to the second ADC.

* * * * *